United States Patent
Izenberg et al.

(10) Patent No.: US 8,612,822 B1
(45) Date of Patent: Dec. 17, 2013

(54) METHOD AND APPARATUS FOR ENHANCED ERROR CORRECTION

(75) Inventors: Erez Izenberg, Tel Aviv (IL); Oren Shafrir, Tel Aviv (IL); Erez Amit, Rehovot (IL); Dimitry Melts, Tel Aviv (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 322 days.

(21) Appl. No.: 12/985,978

(22) Filed: Jan. 6, 2011

Related U.S. Application Data

(60) Provisional application No. 61/293,125, filed on Jan. 7, 2010.

(51) Int. Cl.
*H03M 13/00* (2006.01)

(52) U.S. Cl.
USPC .......................................................... 714/755

(58) Field of Classification Search
None
See application file for complete search history.

(56) References Cited

U.S. PATENT DOCUMENTS

| | | | | |
|---|---|---|---|---|
| 7,043,162 | B2* | 5/2006 | Kubo et al. | 398/140 |
| 7,111,221 | B2* | 9/2006 | Birru et al. | 714/755 |
| 7,934,244 | B2* | 4/2011 | Kim et al. | 725/116 |
| 7,992,068 | B2* | 8/2011 | Chen et al. | 714/755 |
| 8,145,776 | B2* | 3/2012 | Song et al. | 714/776 |
| 2009/0263130 | A1* | 10/2009 | Luo et al. | 398/58 |
| 2011/0164877 | A1* | 7/2011 | Li et al. | 398/66 |
| 2012/0045207 | A1* | 2/2012 | Luo et al. | 398/58 |
| 2012/0069892 | A1* | 3/2012 | Kim et al. | 375/232 |
| 2012/0084621 | A1* | 4/2012 | Hong et al. | 714/755 |

OTHER PUBLICATIONS

ITU-T Recommendation G.984.1, "Gigabit-capable Passive Optical Networks (GPON): General characteristics," *International Telecommunication Union*, Mar. 2003, 22 pages.

ITU-T Recommendation G.984.2, "Gigabit-capable Passive Optical Networks (GPON): Physical Media Dependent (PMD) layer specification," *International Telecommunication Union*, Mar. 2003, 38 pages.

ITU-T Recommendation G.984.2 (2003)—Amendment 1, "Gigabit-capable Passive Optical Networks (GPON): Physical Media Dependent (PMD) layer specification, Amendment 1: New Appendix III—Industry best practice for 2.488 Gbit/s downstream, 1.244 Gbit/s upstream G-Pon," *International Telecommunication Union*, Feb. 2006, 12 pages.

ITU-T G.984.3 Implementers' Guide, "Implementers' Guide for ITU-T Rec. G.984.3 (Feb. 2004)," *International Telecommunication Union*, Feb. 17, 2006, 20 pages.

ITU-T Recommendation G.984.3 (2004)—Amendment 1, "Gigabit-capable Passive Optical Networks (GPON): Transmission convergence layer specification, Amendment 1," *International Telecommunication Union*, Jul. 2005, 46 pages.

ITU-T Recommendation G.984.3 (2004)—Amendment 2, "Gigabit-capable Passive Optical Networks (GPON): Transmission convergence layer specification, Amendment 2," *International Telecommunication Union*, Mar. 2006, 14 pages.

(Continued)

*Primary Examiner* — Guerrier Merant

(57) ABSTRACT

A data unit is received, wherein the data unit includes a primary information data structure and a primary redundancy data structure. A field in the primary information data structure is detected. A secondary error correction operation is performed on the detected field. After performing the secondary error correction operation, a primary error correction operation is performed on the data unit using the primary redundancy data structure.

20 Claims, 7 Drawing Sheets

(56) References Cited

OTHER PUBLICATIONS

ITU-T Recommendation G.984.3 (2004)—Amendment 3, "Gigabit-capable Passive Optical Networks (GPON): Transmission convergence layer specification, Amendment 3," *International Telecommunication Union*, Dec. 2006, 12 pages.

ITU-T Recommendation G.984.3 (Mar. 2008), "Gigabit-capable Passive Optical Networks (GPON): Transmission convergence layer specification," *International Telecommunication Union*, Mar. 2008, 146 pages.

ITU-T Recommendation G.984.3 (2008)—Amendment 1, "Gigabit-capable Passive Optical Networks (GPON): Transmission convergence layer specification, Amendment 1—Specification of the ONU registration method and various clarifications," *International Telecommunication Union*, Feb. 2009, 16 pages.

ITU-T Recommendation G.984.3 (2008)—Amendment 2, "Gigabit-capable Passive Optical Networks (GPON): Transmission convergence layer specification, Amendment 2—Time-of-day distribution and maintenance updates and clarifications," *International Telecommunication Union*, Nov. 2009, 18 pages.

ITU-T Recommendation G.984.3 (2008)—Amendment 3, "Gigabit-capable Passive Optical Networks (GPON): Transmission convergence layer specification, Amendment 3," *International Telecommunication Union*, Apr. 2012, 18 pages.

\* cited by examiner

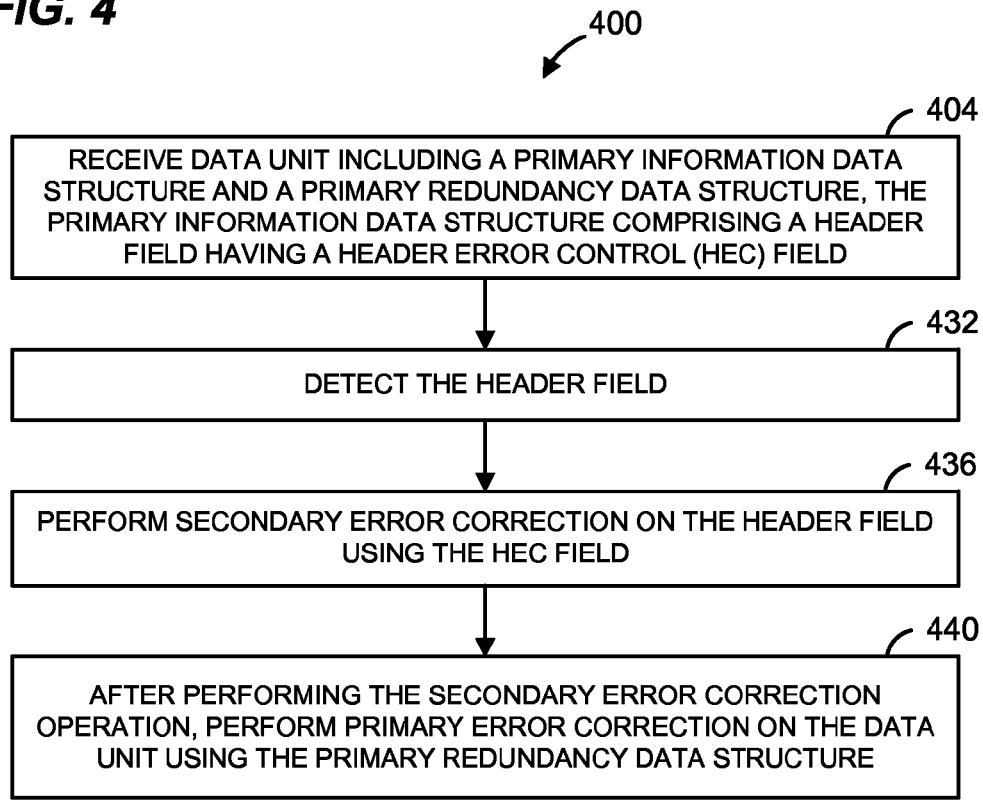
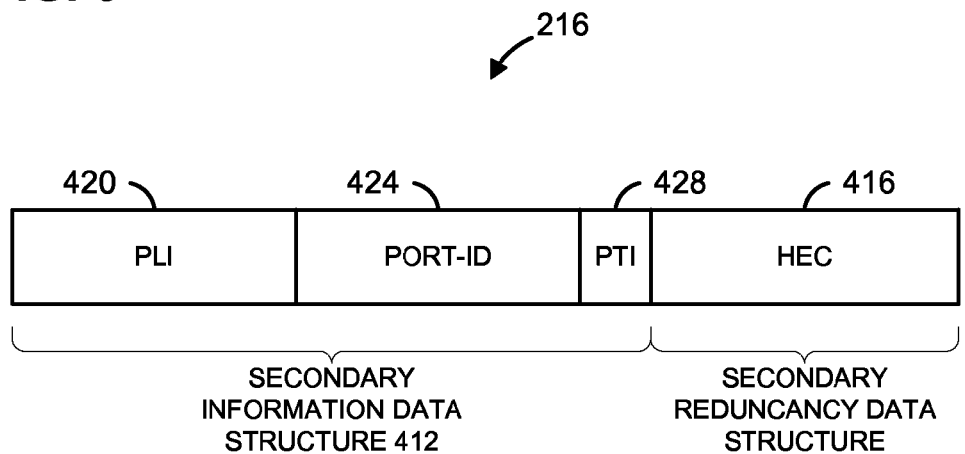

METHOD AND APPARATUS FOR ENHANCED ERROR CORRECTION

CROSS-REFERENCES TO RELATED APPLICATION

The present application claims the benefit of U.S. Provisional Patent Application No. 61/293,125, entitled "Enhanced FEC for GPON Applications," filed on Jan. 7, 2010, which is hereby incorporated by reference herein in its entirety.

FIELD OF TECHNOLOGY

The present disclosure relates generally to communication systems and, more particularly, to error correction.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Forward error correction (FEC) is often used in communication systems. With FEC, a transmitter device encodes data that is to be transmitted, and the encoding introduces redundancy. At a receiver, a decoder utilizes the redundancy to correct errors in the received data, where the errors occurred as a result of transmission. As redundancy is increased, more errors can be corrected at the receiver. On the other hand, as redundancy increases, more transmission bandwidth is utilized for transmitting redundancy symbols and therefore less bandwidth is available for transmitting information symbols.

One example of an FEC code is Reed-Solomon, which is a type of block code. A block code encodes a block of information symbols by adding redundancy symbols to the original information symbols. With Reed-Solomon (RS), a block of information symbols and their associated redundancy symbols are often referred to as a codeword. A common RS codeword size is (255, 239), which indicates a codeword of size of 255 bytes, with 239 information bytes and 16 redundancy bytes.

One type of communication system that utilizes RS(255, 239) is the Gigabit-capable Passive Optical Network (GPON), which operates according to the G.984.3 Standard, defined by the International Telecommunication Union (ITU).

SUMMARY

In an embodiment, a method includes a) receiving a data unit comprising a primary information data structure and a primary redundancy data structure, and b) detecting one or more fields in the primary information data structure. The method also includes c) performing a respective secondary error correction operation on each of at least one of the detected one or more fields, and d) after act c), performing a primary error correction operation on the data unit using the primary redundancy data structure.

In another embodiment, an apparatus comprises a processing unit configured to process data units received via a network, wherein each data unit comprises a primary information data structure and a primary redundancy data structure. The processing unit is configured to detect one or more fields in the primary information data structure. The processing unit includes a primary error correction unit and a secondary error correction unit. The secondary error correction unit is configured to perform a respective secondary error correction operation on each of at least one of the one or more fields detected in the primary information data structure. The primary error correction unit is configured to perform a primary error correction operation on the data unit using the primary redundancy data structure after the secondary error correction unit performs the respective secondary error correction operation on each of the at least one of the one or more detected fields.

In yet another embodiment, an apparatus comprises a processing unit configured to process block code forward error correction (FEC) encoded data units received via a network, wherein each data unit comprises a primary information data structure and a primary redundancy data structure. The processing unit is configured to detect a field in the primary information data structure. The processing unit includes a primary error correction unit and a secondary error correction unit. The secondary error correction unit is configured to correct an error in the detected field. The primary error correction unit is configured to perform a primary error correction operation on the data unit using the primary redundancy data structure after the secondary error correction unit corrects the error in the detected field.

BRIEF DESCRIPTION OF THE DRAWINGS

FIG. 4 is a flow diagram of another example method for decoding an FEC encoded data unit, according to another embodiment.

FIG. 5 is a diagram of a header of a GPON encapsulation method (GEM) frame, as specified by the G.984.3 Standard.

DETAILED DESCRIPTION

In embodiments disclosed herein, enhanced error correction techniques are utilized to improve error correction performance. Generally, a data unit, such as a communication frame, is encoded according to a forward error correction (FEC) technique so that the data unit includes an information data structure and a redundancy data structure. When a receiver receives the data unit, one or more fields in the information data structure are detected and error correction is performed on the one or more fields. Then, error correction is performed on the data unit using the redundancy data structure. The term "data structure" refers to an arrangement of information, such as a field, multiple fields, a portion of a field, a header of a communication frame, a payload of a communication frame, a communication frame, multiple frames, a sub-frame, or any combination thereof.

In some embodiments, enhanced error correction techniques are utilized in a Gigabit-capable Passive Optical Network (GPON), which operates according to the G.984.3 Standard, defined by the International Telecommunication Union (ITU). For explanatory purposes, example enhanced error correction techniques will be described in the context of GPON and the G.984.3 Standard. In other embodiments, however, enhanced error correction techniques are utilized in other types of networks such as other passive optical networks that operate according to a protocol different than the G.984.3 Standard, active optical networks, wired networks, wireless networks, etc., and/or with other communication protocols. For example, techniques described herein can be utilized with other types of communication protocols in which a primary forward error correction (FEC) is applied to a data unit and secondary error correction is applied on one or more fields within the data unit. As another example, techniques described herein can be utilized with other types of communication protocols in which FEC is applied to a data unit and an expected value or values of one or more fields within the data unit can be determined prior to performing error correction on the data unit as a whole.

Figure 1:
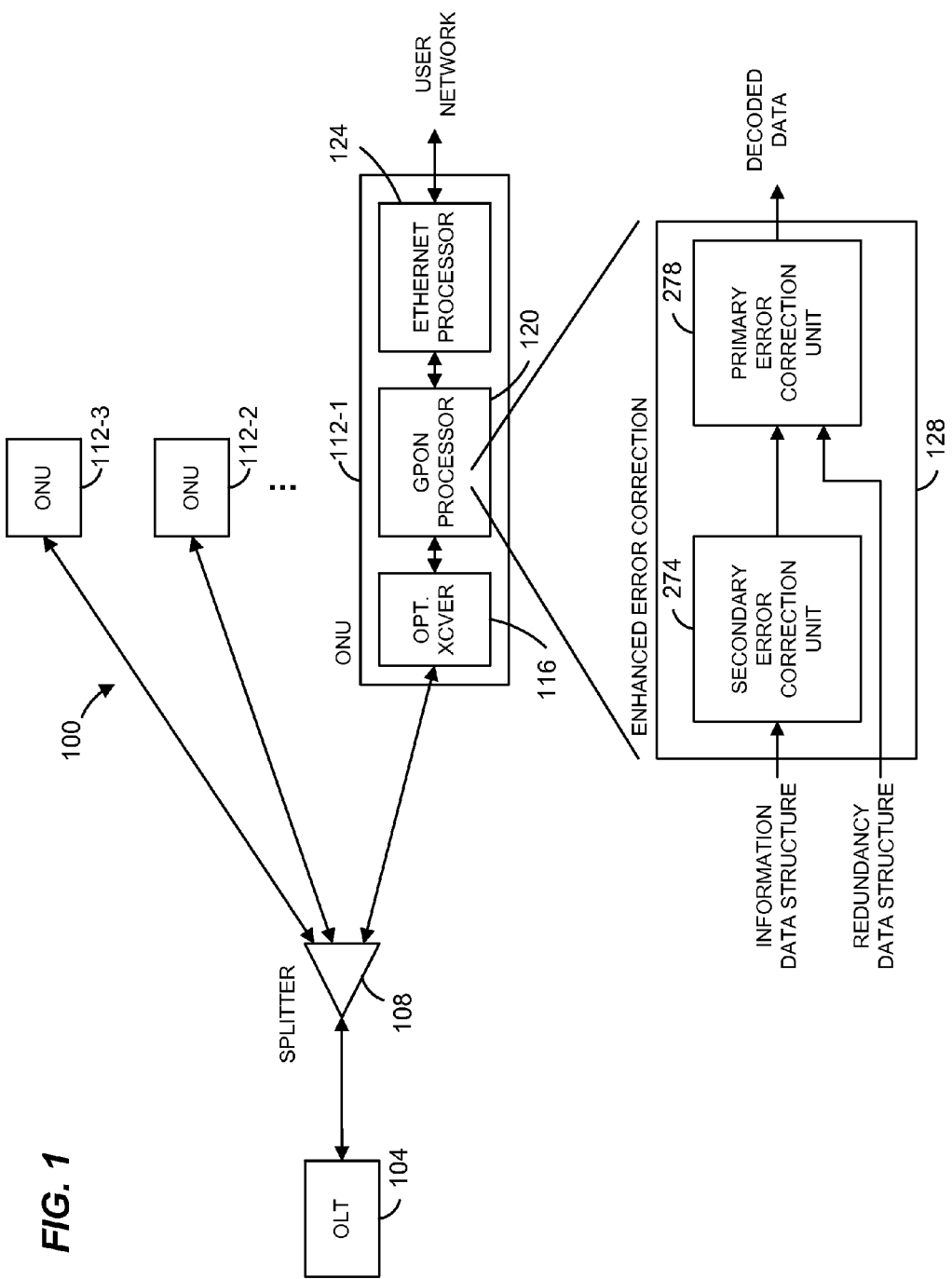
FIG. 1 is block diagram of an example Gigabit-capable Passive Optical Network (GPON) that utilizes an enhanced error correction technique, in an embodiment.

FIG. 1 is block diagram of an example GPON network 100. The network 100 includes an optical line termination (OLT) unit 104, optically coupled to a splitter 108. The splitter 108 is also optically coupled to one or more optical network units (ONUs) 112. Typically, the OLT unit 104 is located in a central office of a service provider, whereas the ONUs 112 are typically located at end user locations, such as homes. Downstream signals (i.e., from the OLT unit 104 to the ONUs 112) are broadcast via a shared optical fiber. In particular, the downstream signal transmitted by the OLT unit 104 is split by the splitter 108, and the downstream signal is received by each of the ONUs 112.

In an embodiment, the ONU 112-1 includes an optical transceiver 116 coupled to a GPON processing unit 120. The GPON processing unit 120 generally performs processing functions associated with the GPON network, such as media access control (MAC) functions. For example, the GPON processing unit 120 processes data received from the OLT unit 104 and forwards the data to an Ethernet processing unit 124, which is configured to transmit the data via a user network according to an Ethernet protocol. In one embodiment, the user network is a network of devices such as one or more of a computing device (e.g., a personal computer), a switching device (e.g., an Ethernet switch), a router, a wireless routing device, etc. In another embodiment, the user network is a communication link between a first device, such as the ONU 112-1, and a second device such as a computing device (e.g., a personal computer), a switching device (e.g., an Ethernet switch), a router, a wireless routing device, etc. In the embodiment of FIG. 1, the user network comprises an Ethernet link. In other embodiments, the user network comprises another type of link such as a wireless local area network (WLAN) link, a cellular communication link, a satellite communication link, etc. Thus, in some embodiments, a suitable processing unit other than the Ethernet processing unit 124 is utilized.

The Ethernet processing unit 124 receives data from the user network and forwards the data to the GPON processing unit 120, which formats the data for transmission to the OLT unit 104 via an upstream GPON transmission.

In an embodiment, the GPON processing unit 120 includes an error correction unit 128 that utilizes enhanced error correction techniques, which are described in more detail below. In particular, the OLT unit 104 FEC encodes downstream data, and the error correction unit 128 performs enhanced error correction on the FEC encoded data. In an embodiment, the ONU 112-2 and the ONU 112-3 each have a structure that is the same as or similar to the ONU 112-1.

The OLT unit 104 utilizes the RS(255, 239) code for FEC, according to the G.984.3 Standard, as will be described in more detail below.

Figure 2A:
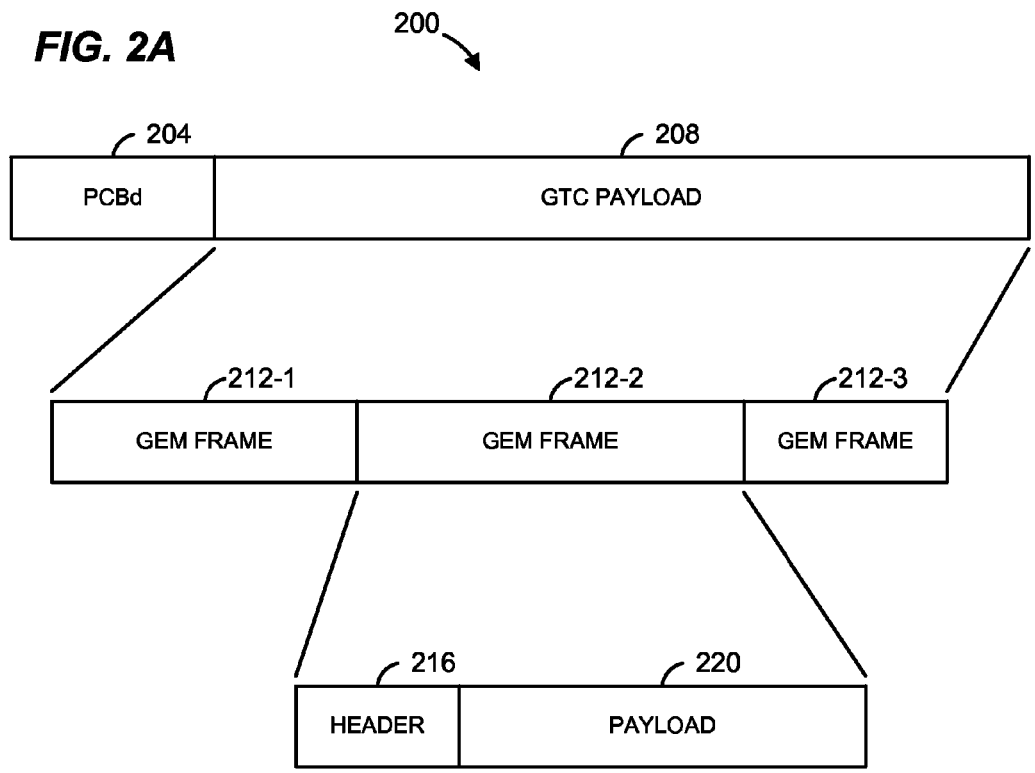
FIG. 2A is a diagram of a GPON transmission convergence layer frame (GTC frame) according to the G.984.3 Standard, defined by the International Telecommunication Union (ITU).

As specified by the G.984.3 Standard, downstream transmissions are formatted into frames, referred to as GPON transmission convergence layer frames (GTC frames). FIG. 2A is diagram of a GTC frame 200 according to the G.984.3 Standard. The GTC frame 200 includes a header 204, referred to as a physical control block, downstream (PCBd), and the GTC frame 200 also includes a payload 208. As specified by the G.984.3 Standard, the GTC frame 200 is a fixed length frame.

The payload 208 includes a plurality of GPON encapsulation method (GEM) frames 212. As specified by the G.984.3 Standard, each GEM frame 212 is of a variable length, and each GEM frame includes a GEM header 216 and optionally a GEM payload 220. For example, during periods of low system utilization, "idle" GEM frames (e.g., GEM frames that omit a payload 220) are transmitted in the GTC frame 200, in some implementations.

Figure 2B:
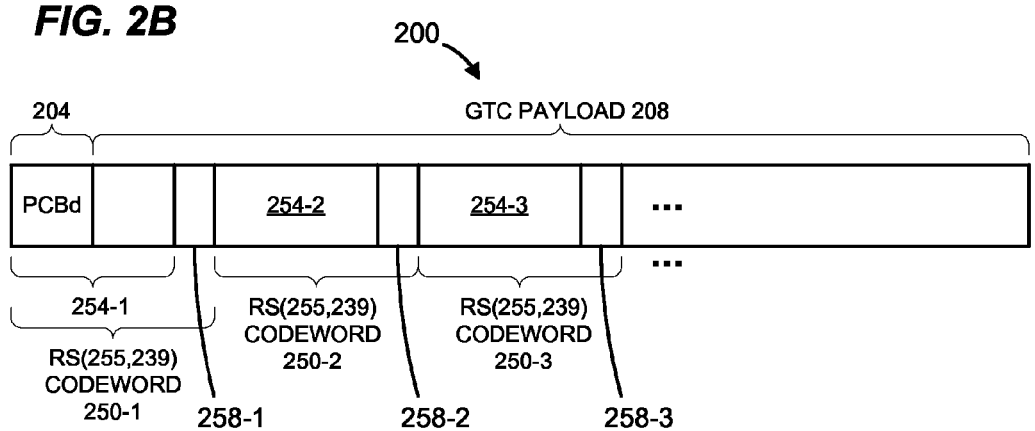
FIG. 2B is a diagram of the GTC frame of FIG. 2A showing forward error correction (FEC) encoding according to the G.984.3 Standard.

FIG. 2B is a diagram of the GTC frame 200 showing FEC encoding according to the G.984.3 Standard. As discussed above, the OLT unit 104 utilizes the RS(255, 239) code for FEC, and FIG. 2B illustrates the GTC frame 200 comprising a plurality of length-255 codewords 250. Each codeword 250 includes an information data structure 254, which has a length of 239 bytes, and a redundancy data structure 258, which has a length of 16 bytes. In the codeword 250-1, the information data structure 254-1 includes the PCBd 204 and a portion of the GTC payload 208. The corresponding information data structure 254 for each of the codewords 254-2, 254-3, etc., includes a respective portion of the GTC payload 208. The information data structures 254 include unmodified data from the GTC frame 200. Referring now to FIGS. 1 and 2B, the OLT unit 104 encodes the GTC frame 200 by generating the codewords 250.

Referring again to FIG. 1, the enhanced error correction unit 128 receives a data unit on which forward error correction (FEC) has been applied (e.g., by the OLT 104). The enhanced error correction unit 128 generally detects one or more fields within the received data unit and corrects errors within the one or more fields (if errors are present) prior to decoding according to the FEC applied to the data unit.

In an embodiment, the data unit received by the enhanced error correction unit 128 includes an information data structure and a redundancy data structure. For example, in an embodiment, the data unit comprises an FEC block code codeword, such as an RS codeword. For instance, in the G.984.3 Standard, a codeword 250 includes an information data structure 254 (e.g., original data) and a redundancy data structure 258. The information data structure includes one or more fields, such as a header, one or more fields within the header (e.g., a header error control field such as a cyclic redundancy check (CRC) field), one or more fields in a payload associated with the header, etc.

A secondary error correction unit 274 is configured to detect one or more fields in the information data structure, such as a header, one or more fields within the header (e.g., a header error control field such as a cyclic redundancy check (CRC) field), one or more fields in a payload associated with the header, etc. In an embodiment, the information data structure includes original data, and fields within the information data structure are detected using a suitable technique or mechanism. For example, in one embodiment, the secondary error correction unit 274 includes a pattern matcher to detect a known pattern in the information data structure, and the secondary error correction unit 274 is configured to detect a field based on a known offset from the detected pattern to the field.

The secondary error correction unit 274 is also configured to perform a secondary error correction operation on each of the one or more detected fields. For example, if a detected field is protected with an error control field such as a CRC, the secondary error correction unit 274 is configured to utilize the error control field to correct errors in the detected field, in an embodiment. In an embodiment, the error control field is included in the information data structure. As another example, if a detected field is a field set to a known value, the secondary error correction unit 274 is configured to utilize the known value to correct errors in the detected field, in an embodiment. For example, the secondary error correction unit 274 is configured to override the detected field to the known value. In one embodiment, the secondary error correction unit 274 includes a block FEC decoder. In an embodiment, performing a secondary error correction operation comprises correcting a field when one or more errors in the field are detected, but leaving the field as-is when no errors are detected. In another embodiment, performing the secondary error correction operation comprises overriding a field with a value whether or not an error is detected. Thus, in some embodiments in which performing the secondary error correction operation comprises overriding a field with a value whether or not an error is detected, performing the secondary error correction operation omits detecting whether an error in the field has occurred.

A primary error correction unit 278 is configured to perform a primary error correction operation on the data unit using the redundancy data structure. For example, with a codeword 250, the primary error correction unit 278 is configured to perform the RS decoding using the redundancy data structure 258, in an embodiment. In one embodiment, the primary error correction unit 278 is a block FEC decoder such as an RS decoder.

In an embodiment, the enhanced error correction unit 128 is configured to operate at least at wire speed. For example, in an embodiment, the enhanced error correction unit 128 is configured to perform primary and secondary error correction on each received data unit at a speed adequate to keep up with rate at which the data units are received. For example, in an embodiment in which the data units are RS codewords, the enhanced error correction unit 128 is configured to perform primary and secondary error correction on each received RS codeword at a speed adequate to keep up with rate at which the RS codewords are received.

Referring to FIG. 1, in other embodiments, enhanced error correction techniques are utilized in other types of networks such as other optical networks, wired networks, wireless networks, etc., and/or with other communication protocols. For example, in other embodiments, enhanced error correction techniques are utilized in a system that does not utilize GPON and/or optical communication links. Thus, in some embodiments, a processing unit other than the GPON processing unit 120 and/or a processing unit other than the Ethernet processing unit 124 is utilized. Similarly, in some embodiments, a suitable transceiver other than the optical transceiver 116 is utilized.

Figure 3:
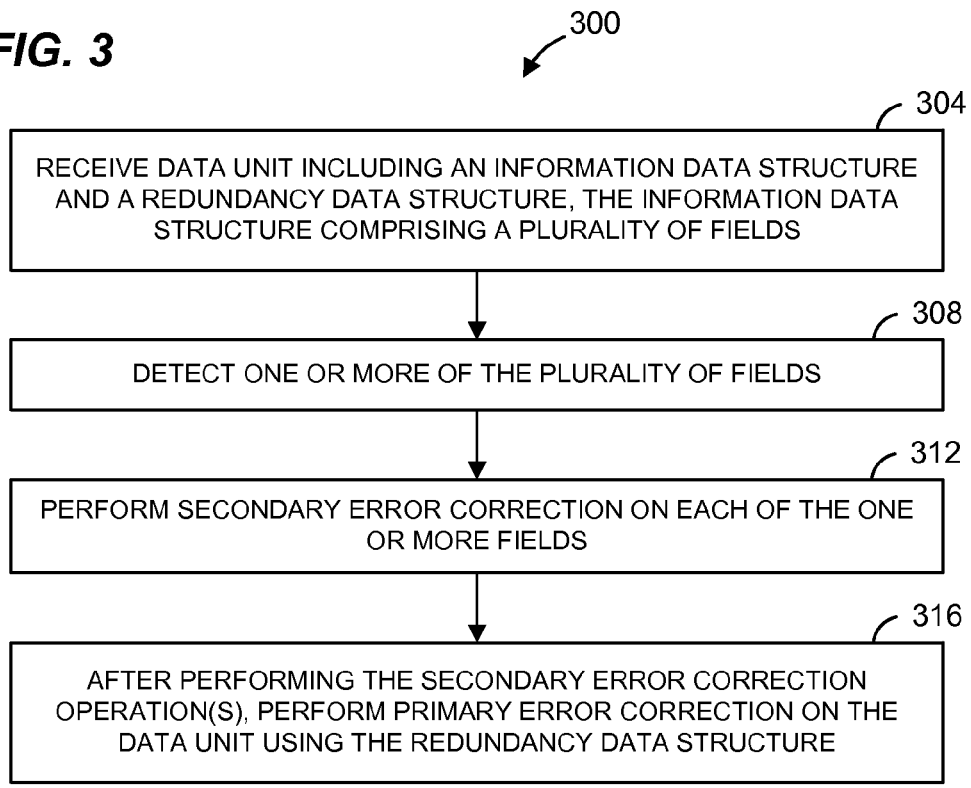
FIG. 3 is a flow diagram of an example method for decoding an FEC encoded data unit, according to an embodiment.

FIG. 3 is a flow diagram of an example method 300 for decoding an FEC encoded data unit. The method 300 is implemented by the error correction unit 128 of FIG. 1, in an embodiment. For ease of explanation, the method 300 is described with reference to FIGS. 1, 2A, and 2B. In other embodiments, however, the method 300 is utilized in a communication system other than a GPON system and/or with a communication protocol other than the protocol specified by the G.984.3 Standard.

At block 304, a data unit is received. The data unit includes an information data structure and a redundancy data structure. For example, in an embodiment, the received data unit comprises an FEC block code codeword, such as an RS codeword. For instance, in the G.984.3 Standard, a codeword 250 includes an information data structure 254 (e.g., original data) and a redundancy data structure 258. The information data structure includes a plurality of fields, such as a header, fields within the header (e.g., a header error control field such as a cyclic redundancy check (CRC) field), fields in a payload associated with the header, etc. Thus, in an embodiment corresponding to a network utilizing the G.984.3 Standard, each codeword 250 corresponds to the received data unit of block 304.

At block 308, one or more of the plurality of fields is detected. In an embodiment, the information data structure includes original data and a field within the information data structure is detected using a suitable technique or mechanism. For example, in one embodiment, a known pattern in the information data structure is detected and a known offset from the known pattern to a field in the information data structure is utilized to detect the field. As an example, the codeword 250-1 includes the PCBd 204, which includes a known pattern such as a sync pattern and a plurality of fields. A known field in the PCBd 204 is detected by detecting the sync pattern and based on a known offset from the sync pattern to the known field in the PCBd 204, in an embodiment.

At block 312, secondary error correction on each of the one or more fields detected at the block 308 is performed on the one or more fields. For example, if a detected field is protected with an error control field such as a CRC, the error control field is utilized to correct errors in the detected field, in an embodiment. In an embodiment, the error control field is included in the information data structure. In an embodiment, processing of the error control field indicates that no errors are present in the detected field, no further action is taken on the field at block 312. As another example, if a detected field is a field set to a known value, the known value is utilized to correct errors in the detected field, in an embodiment. For example, the detected field is overridden to the known value. In an embodiment, the detected field is overridden to the known value when an error in the detected field is determined. In an embodiment, the detected field is overridden to the known value without first determining whether an error in the detected field is present.

At block 316, a primary error correction operation is performed on the data unit using the redundancy data structure. For example, in the codeword 250-1, RS decoding is performed using the redundancy data structure 258-1, in an embodiment.

The primary error correction at block 316 is performed after the secondary error correction at block 312. As a result, the secondary error correction (block 312) corrects one or more errors in the received data unit prior to primary error correction (block 316), at least in some scenarios, and thus reduces the number of errors to be corrected by the primary error correction operation. In some embodiments, the primary error correction operation has a maximum number of errors that it can correct, and the maximum number of errors is a function of the size of the redundancy data structure. For example, a larger redundancy data structure permits correction of more errors, whereas a smaller redundancy data structure permits correction of fewer errors. In some embodiments, if the number of errors in the data unit exceeds the maximum number of errors, the primary error correction operation actually introduces errors to the data unit. Thus, in some scenarios, the secondary error correction operation may reduce the number of errors in the data unit to be at or below the maximum number of errors before the primary error correction operation is performed, thus improving performance of the primary error correction operation.

Referring now to FIGS. 1 and 3, the enhanced error correction unit 128 is configured to implement the method 300 of FIG. 3, in an embodiment. In other embodiments, the method 300 is implemented by another suitable error correction unit and/or in a system other than the system 100.

Various embodiments of the method 300 and the enhanced error corrector unit 128 will now be discussed.

FIG. 4 is a flow diagram of an example method 400 for decoding an FEC encoded data unit. The method 400 is implemented by the error correction unit 128 of FIG. 1, in an embodiment. For ease of explanation, the method 400 is described with reference to FIGS. 1, 2A, and 2B. In other embodiments, however, the method 400 is utilized in a communication system other than a GPON system and/or with a communication protocol other than the protocol specified by the G.984.3 Standard.

At block 404, a data unit is received. The data unit includes a primary information data structure and a primary redundancy data structure. For example, in an embodiment, the data unit comprises a block FEC codeword, such as an RS codeword. For instance, in the G.984.3 Standard, the codeword 250 includes an information data structure 254 (e.g., original data) and a redundancy data structure 258. The information data structure includes a header field, wherein the header field includes a header error control (HEC) field such as a cyclic redundancy check (CRC) field.

In an embodiment, the header field in the information data structure is the GEM header 216. FIG. 5 is a diagram of the GEM header 216 as specified by the G.984.3 Standard. The GEM header 216 includes a secondary information data structure 412 and an HEC field 416 (i.e., a secondary redundancy data structure). The secondary information data structure 412 includes a payload length indicator (PLI) field 420, a port-ID field 424, and a payload type indicator (PTI) field 428. The PLI field 420 indicates a length in bytes of the payload following the GEM header 216. The port-ID field 424 is utilized to provide a traffic indicator to facilitate traffic multiplexing on the passive optical network. The PTI field 428 indicates a content type of the payload following the GEM header 216 and an appropriate treatment of the payload.

In an embodiment, the secondary information data structure 412 is encoded with a Bose, Ray-Chaudhuri, Hocquenghem (BCH) code and a parity bit to generate the HEC field 416. In particular, secondary information data structure 412 is encoded with the BCH code and a parity bit is set so that the total number of ones in the header 216 is even.

Referring again to FIG. 4, at block 432, the header field is detected using a suitable technique or mechanism. For example, in one embodiment, a length of a previously detected GEM frame and a known starting point of the previously detected GEM frame are utilized to detect the header field 216 of a current GEM frame. As another example, in one embodiment, a detected PCBd field 204 and a known length of the PCBd field 204 is utilized to detect the GEM header 216 of the first GEM frame 212 in the GTC payload 208. According to the G.984.3 Standard, the PCBd field 204 precedes the corresponding GTC payload 208, which includes a plurality of GEM frames 212.

At block 436, secondary error correction is performed on the header field. For example, if a detected header field is a GEM header 216, the HEC field 416 is utilized to perform secondary error correction on the GEM header 216, in an embodiment. For instance, in an example, performing secondary error correction on the GEM header 216 comprises performing a BCH decoding operation on the GEM header 216, in an embodiment.

At block 440, a primary error correction operation is performed on the data unit using the primary redundancy data structure. For example, in the codeword 250, an RS decoding operation is performed using the redundancy data structure 258, in an embodiment.

Referring again to FIG. 1, the enhanced error correction unit 128 is configured to implement the method 400 of FIG. 4, in an embodiment. For instance, the enhanced error correction unit 128 receives a data unit that includes a primary information data structure and a primary redundancy data structure. For example, in an embodiment, the data unit comprises an FEC block code codeword, such as an RS codeword. For instance, in the G.984.3 Standard, a codeword 250 includes an information data structure 254 (e.g., original data) and a redundancy data structure 258 (FIG. 2B). In an embodiment, the information data structure 254 of FIG. 2B corresponds to the primary information data structure referred to in FIG. 4, and the redundancy data structure 258 (FIG. 2B) corresponds to the primary redundancy data structure referred to in FIG. 4. The primary information data structure (e.g., the information data structure 254) includes a header field having an HEC field, such as a CRC field. In one embodiment, the primary information data structure (e.g., the information data structure 254) includes a GEM header 216. In an embodiment, secondary error correction is performed on the GEM header 216 using the HEC field 416. In other embodiments, enhanced error correction unit 128 is configured to operate on different types of header fields.

The secondary error correction unit 274 is configured to detect the GEM header 216 using a suitable technique or mechanism. In an embodiment, the secondary error correction unit 274 includes a GEM header detector.

The secondary error correction unit 274 is also configured to perform a secondary error correction operation on the GEM header 216 utilizing the HEC field 416. For example, the secondary error correction unit 274 is configured to utilize a BCH decoding technique and the HEC field 416 to correct errors in the GEM header 216, in an embodiment. In one embodiment, the secondary error correction unit 354 includes a block FEC decoder such as a BCH decoder.

Figure 6:
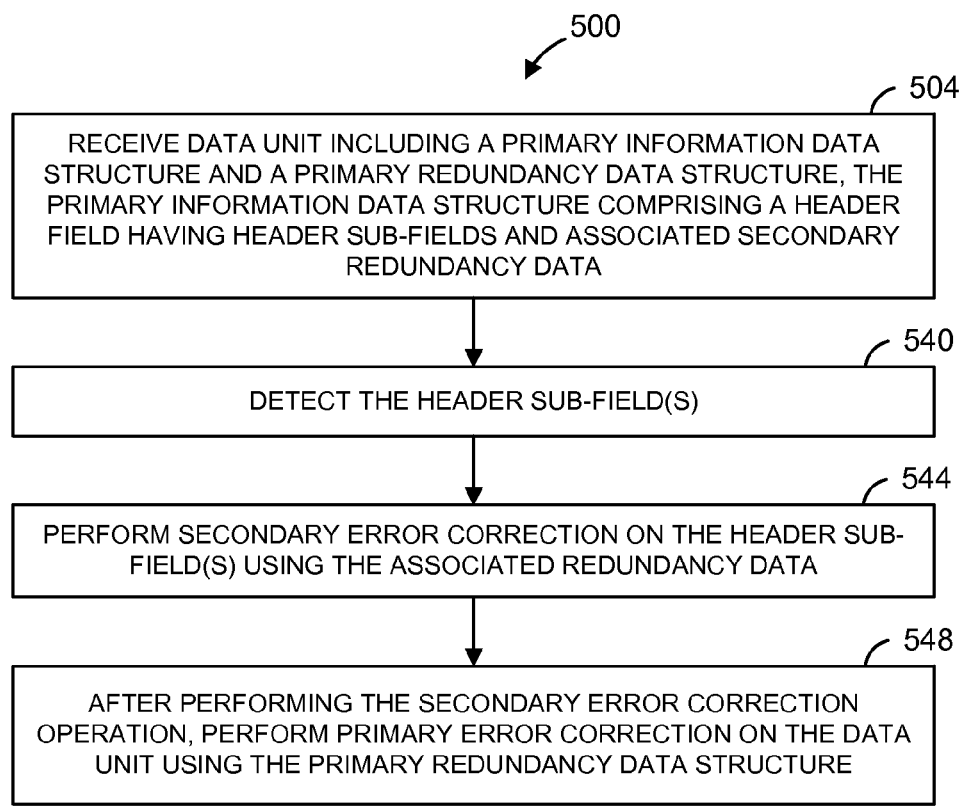
FIG. 6 is a flow diagram of another example method for decoding an FEC encoded data unit, according to another embodiment.

FIG. 6 is a flow diagram of an example method 500 for decoding an FEC encoded data unit. The method 500 is implemented by the error correction unit 128 of FIG. 1, in an embodiment. For ease of explanation, the method 500 is described with reference to FIGS. 1, 2A, and 2B. In other embodiments, however, the method 500 is utilized in a communication system other than a GPON system and/or with a communication protocol other than the protocol specified by the G.984.3 Standard.

At block 504, a data unit is received. The data unit includes a primary information data structure and a primary redundancy data structure. For example, in an embodiment, the data unit comprises a block FEC codeword, such as an RS codeword. For instance, referring to FIG. 2B, in the G.984.3 Standard, the codeword 250 includes an information data structure 254 (e.g., original data) and a redundancy data structure 258. In an embodiment, the information data structure 254 of FIG. 2B corresponds to the primary information data structure referred to in FIG. 6, and the redundancy data structure 258 (FIG. 2B) corresponds to the primary redundancy data structure referred to in FIG. 6. The primary information data structure (e.g., the information data structure 254-1) includes a header field (e.g., the PCBd 204), wherein the header field includes one or more header subfields, each header subfield having associated secondary redundancy data.

Figure 7A:
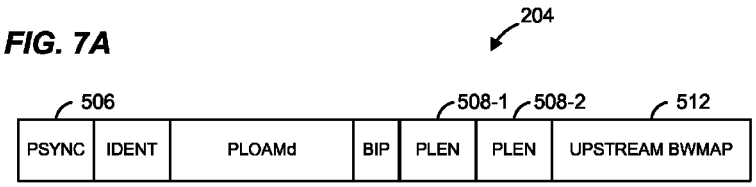
FIG. 7A is a diagram of a physical control block, downstream (PCBd) header, as specified by the G.984.3 Standard.
Figure 7B:
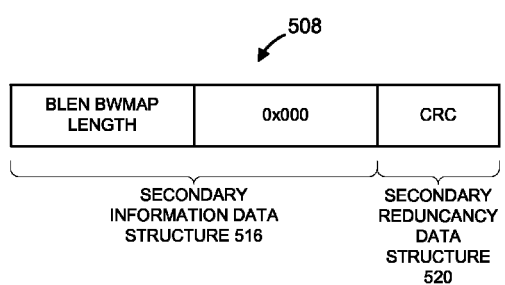
FIG. 7B is a diagram of a payload length (plen) field of the PCBd header of FIG. 7A, as specified by the G.984.3 Standard.
Figure 7C:
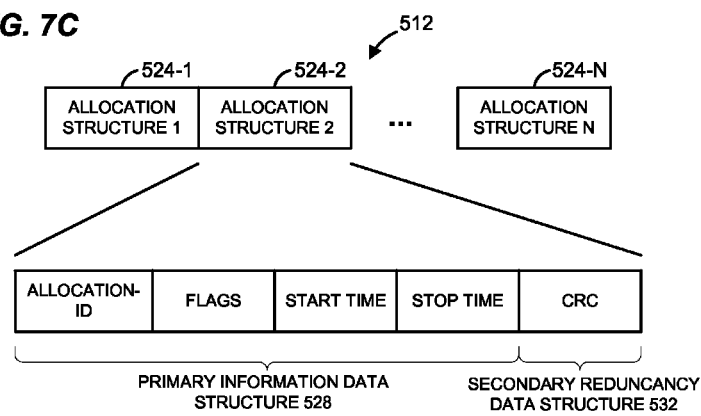
FIG. 7C is a diagram of a bandwidth map field of the PCBd header of FIG. 7A, as specified by the G.984.3 Standard.

In an embodiment, the header field in the information data structure is the PCBd header 204. FIGS. 7A-7C are diagrams of showing various fields within the PCBd header 204 (as specified by the G.984.3 Standard) that can be detected and corrected using secondary error correction. For instance, FIG. 7A is a diagram of the PCBd header 204 as specified by the G.984.3 Standard. The PCBd header 204 includes a physical synchronization (psync) field 506 that includes a known pattern. In an embodiment, the GPON processor 120 is configured to detect the PCBd header 204 using the psync field 206.

The PCBd header 204 also includes a payload length (plen) field 508 to indicate a length of an uplink bandwidth map (uplink BWMAP) field 512. The plen field 508 is transmitted by the OLT unit 104 (FIG. 1) twice for robustness. As illustrated in FIG. 7B, the plen field 508 includes a secondary information data structure 516 and a secondary redundancy data structure 520. In an embodiment, the secondary information data structure 516 is encoded with a CRC-8 code to generate the secondary redundancy data structure 520.

As illustrated in FIG. 7C, the uplink BWMAP field 512 includes one or more allocation structures 524, each allocation structure 524 indicating a bandwidth allocation to a particular transmission container (T-CONT), which represents a group of logical connections for purposes of upstream bandwidth assignment on the passive optical network. Each allocation structure 524 includes a secondary information data structure 528 and a secondary redundancy data structure 532.

Referring to FIGS. 7B and 7C, the plen fields 508 and the allocation structures 524 are examples of the one or more header subfields referred to with respect to block 504. For instance, each plen field 508 is an example of a header subfield having associated secondary redundancy data (i.e., the secondary redundancy data structure 520). Similarly, each allocation structure 524 is an example of a header subfield having associated secondary redundancy data (i.e., the secondary redundancy data structure 532).

Referring again to FIG. 6, at block 540, the one or more header subfields (e.g., the plen fields 508 and the allocation structures 524) are detected using a suitable technique or mechanism. For example, in one embodiment, the PCBd header 204 is detected by detecting the psync field 506. Then, a known starting point of the PCBd header 204 is utilized to detect the one or more header subfields.

At block 544, secondary error correction is performed on each of the one or more header subfields. For example, secondary error correction is performed on one or both of the plen fields 508 using the CRC-8 field 520, in an embodiment.

As another example, secondary error correction is performed on one more of the allocation structures 524 using the CRC-8 field 532, in an embodiment. In another embodiment, secondary error correction is performed on one or both of the plen fields 508 using the CRC-8 field 520, and secondary error correction is performed on one or more of the allocation structures 524 using the CRC-8 field 532. As another example, secondary error correction is performed on less than all allocation structures 524 using the CRC-8 field 532, in an embodiment.

At block 548, a primary error correction operation is performed on the data unit using the primary redundancy data structure. For example, in the codeword 250, an RS decoding operation is performed using the redundancy data structure 258, in an embodiment.

In an embodiment, the enhanced error corrector unit 128 of FIG. 1 is configured to implement the method 500 of FIG. 6. For instance, the enhanced error corrector unit 128 receives a data unit that includes an information data structure and a redundancy data structure. For example, in an embodiment, the data unit comprises an FEC block code codeword, such as an RS codeword. For instance, in the G.984.3 Standard, a codeword 250 includes an information data structure 254 (e.g., original data) and a redundancy data structure 258. The information data structure includes a header field, wherein the header field includes one or more header subfields, each header subfield having associated secondary redundancy data. Each plen field 508 is an example of a header subfield having associated secondary redundancy data (i.e., the secondary redundancy data structure 520). Similarly, each allocation structure 524 is another example of a header subfield having associated secondary redundancy data (i.e., the secondary redundancy data structure 532).

The secondary error correction unit 274 is configured to detect the header subfield(s) using a suitable technique or mechanism. For example, in one embodiment, the secondary error correction unit 274 (or another unit of the GPON processor 120) is configured to detect the PCBd header 204 by detecting the psync field 506. The secondary error correction unit 274 (or another unit of the GPON processor 120) is configured to utilize a known starting point of the PCBd header 204 to detect the one or more header subfields.

The secondary error correction unit 274 is also configured to perform a secondary error correction operation on the one or more header subfields using secondary redundancy data associated with the header subfield(s). For example, the secondary error correction unit 274 is configured to perform secondary error correction on the plen field 508 using the CRC-8 field 520, in an embodiment. As another example, the secondary error correction unit 274 is configured to perform secondary error correction on each allocation structure 524 (or less than all allocation structures 524) using the CRC-8 field 532, in an embodiment. In an embodiment, the secondary error correction unit 274 is configured to perform secondary error correction on the plen field 508 using the CRC-8 field 520, and is configured to perform secondary error correction on each allocation structure 524 (or less than all allocation structures 524) using the CRC-8 field 532. In one embodiment, the secondary error correction unit 274 includes a CRC decoder such as a CRC-8 decoder. In an embodiment, when a correctable error in a header subfield is detected by the secondary error correction unit 274, the secondary error correction unit 274 corrects the correctable error in the header subfield. In an embodiment, when no errors in a header subfield are detected by the secondary error correction unit 274, the secondary error correction unit 274 performs no further processing on the header subfield.

Figure 8:
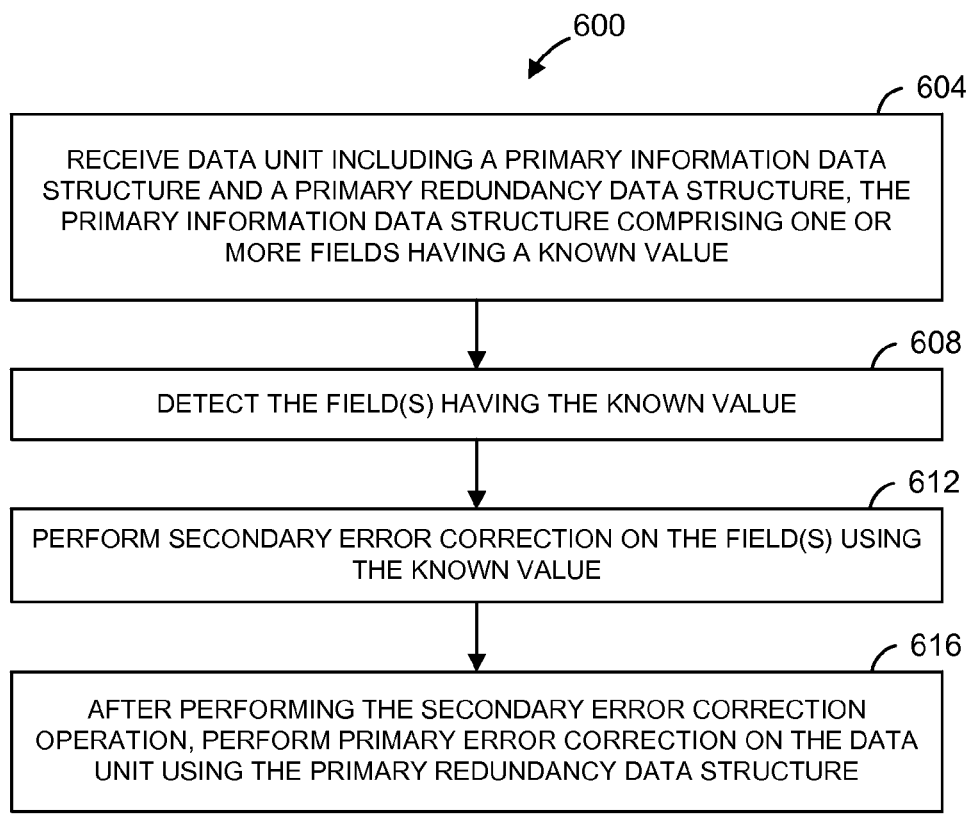
FIG. 8 is a flow diagram of another example method for decoding an FEC encoded data unit, according to an embodiment.

FIG. 8 is a flow diagram of an example method 600 for decoding an FEC encoded data unit. The method 600 is implemented by the error correction unit 128 of FIG. 1, in an embodiment. For ease of explanation, the method 600 is described with reference to FIGS. 1, 2A, and 2B. In other embodiments, however, the method 600 is utilized in a communication system other than a GPON system and/or with a communication protocol other than the protocol specified by the G.984.3 Standard.

At block 604, a data unit is received. The data unit includes a primary information data structure and a primary redundancy data structure. For example, in an embodiment, the data unit comprises a block FEC codeword, such as an RS codeword. For instance, in the G.984.3 Standard, the codeword 250 includes an information data structure 254 (e.g., original data) and a redundancy data structure 258. The information data structure includes one or more fields set to a known value. For example, in some systems that operate according to the G.984.3 Standard, GEM frames 212 with a length-0 payload 220 (i.e., "empty" GEM frames) are transmitted in the GTC frame 200 during periods of low system utilization. The header 216 of an empty GEM frame 212 includes the PLI field 420 set to the value zero. During transmission, an error may be introduced in the PLI field 420 so that the value is no longer zero.

In other embodiments, a communication system transmits other types of fields with a known value for various purposes, such as during periods of low system utilization. As just one example, an OLT unit 104 (FIG. 1) is configured to transmit a GEM frame 212 with the port-ID 424 set to a dedicated value that is not used by any ONU 112 or any service, for example, and with the payload 220 set to a known sequence. Such a GEM frame is referred to herein as a "proprietary idle" GEM frame. Additionally, the PLI field 420 of the proprietary idle GEM frame is set to a known value (i.e., the proprietary idle GEM frame has a fixed length), in an embodiment. In another embodiment, the proprietary idle GEM frame has a variable length, but with an integer number of occurrences of the known sequence.

At block 608, the field set with the known value is detected using a suitable technique or mechanism. For example, in an embodiment in which the field to be detected is the PLI field 420 set to the value zero, block 608 includes detecting an empty GEM frame 212 and then detecting the PLI field 420 of the empty GEM frame 212. In one embodiment, detecting an empty GEM frame 212 comprises detecting two GEM frames 212 that are separated by a length corresponding to the length of the GEM header 216.

As another example, in an embodiment in which the field to be detected is the payload 220 of a proprietary GEM frame 212, block 608 includes detecting the proprietary idle GEM frame 212 and then detecting the payload field 220 of the proprietary idle GEM frame 212. In one embodiment, detecting a proprietary idle GEM frame 212 comprises detecting a GEM frame having the port-ID 424 set to a value indicative of the proprietary idle GEM frame 212.

At block 612, secondary error correction is performed on the field detected at block 608. For example, if the detected field is a PLI field 420 of an empty GEM frame, the PLI field 420 is overridden to be zero, in an embodiment. In one embodiment, it is determined whether the PLI field 420 is already zero (i.e., no errors) and, if the PLI field 420 is already zero, no operation on the PLI field 420 is performed. In another embodiment, PLI field 420 is over-ridden to zero without first checking whether the PLI field 420 is already zero.

As another example, if the detected field is a payload field 220 of a proprietary idle GEM frame, the payload field 220 is over-ridden to the known sequence, in an embodiment. In one embodiment, it is determined whether the payload field 220 is already correct (i.e., no errors) and, if the payload field 220 is already correct, no operation on the payload field 220 is performed. In another embodiment, payload field 220 is over-ridden to the known sequence without first checking whether the payload field 220 is already correct.

At block 616, a primary error correction operation is performed on the data unit using the primary redundancy data structure. For example, in the codeword 250, an RS decoding operation is performed using the redundancy data structure 258, in an embodiment.

In an embodiment, the enhanced error correction unit 128 of FIG. 1 is configured to implement the method 600 of FIG. 9. For instance, the enhanced error correction unit 128 receives a data unit that includes an information data structure and a redundancy data structure. For example, in an embodiment, the data unit comprises an FEC block code codeword, such as an RS codeword. For instance, in the G.984.3 Standard, a codeword 250 includes an information data structure 254 (e.g., original data) and a redundancy data structure 258. The information data structure includes one or more fields set to a known value. For example, in some systems that operate according to the G.984.3 Standard, GEM frames 212 with a length-0 payload 220 (i.e., "empty" GEM frames) are transmitted in the GTC frame 200 during periods of low system utilization. The header 216 of an empty GEM frame 212 includes the PLI field 420 set to the value zero. During transmission, an error may be introduced in the PLI field 420 so that the value is no longer zero.

In other embodiments, a communication system transmits other types of fields with a known value for various purposes, such as during periods of low system utilization. As just one example, an OLT unit 104 (FIG. 1) is configured to transmit a proprietary idle GEM frame having a payload set to a known sequence.

The secondary error correction unit 274 is configured to detect the field set to the known value using a suitable technique or mechanism. For example, in one embodiment, the secondary error correction unit 274 (or another unit of the GPON processor 120) is configured to detect the field set to the known value using a suitable technique or mechanism. For example, in an embodiment in which the field to be detected is the PLI field 420 whose value is set to the value zero, the secondary error correction unit 274 (or another unit of the GPON processor 120) is configured to detect an empty GEM frame 212 and then detect the PLI field 420 of the empty GEM frame 212. In one embodiment, the secondary error correction unit 274 (or another unit of the GPON processor 120) is configured to detect two GEM frames 212 that are separated by a length corresponding to the length of the GEM header 216.

As another example, in another embodiment, the secondary error correction unit 274 (or another unit of the GPON processor 120) is configured to detect the proprietary idle GEM frame 212 and then detect the payload field 220 of the proprietary idle GEM frame 212. In one embodiment, the secondary error correction unit 274 (or another unit of the GPON processor 120) is configured to detect a GEM frame having the port-ID 424 set to a value indicative of the proprietary idle GEM frame.

The secondary error correction unit 274 is also configured to perform a secondary error correction operation on the one or more header subfields using secondary redundancy data associated with the header subfield(s). For example, the secondary error correction unit 274 is configured to override the PLI field 420 to zero if the detected field is a PLI field 420 of an empty GEM frame, in an embodiment. In one embodiment, the secondary error correction unit 274 is configured to determine whether the PLI field 420 is already zero (i.e., no errors) and, the secondary error correction unit 274 is configured to not operate on the PLI field 420 if the PLI field 420 is already zero. In another embodiment, the secondary error correction unit 274 is configured to override the PLI field 420 to zero without first checking whether the PLI field 420 is already zero.

As another example, the secondary error correction unit 274 is configured to override the payload 220 to the known sequence if the detected field is a payload field 220 of a proprietary idle GEM frame, in an embodiment. In one embodiment, the secondary error correction unit 274 is configured to determine whether the payload field 220 is already correct (i.e., no errors) and, the secondary error correction unit 274 is configured to not operate on the payload field 220 if the payload field 220 is already correct. In another embodiment, the secondary error correction unit 354 is configured to override the payload field 220 to the known sequence without first checking whether the payload field 220 is already correct.

In some embodiments, the enhanced error correction unit 128 of FIG. 4 is configured to implement two or more of the method 400 of FIG. 4, the method 500 of FIG. 6, and the method 600 of FIG. 9.

At least some of the various blocks, operations, and techniques described above may be implemented in suitable hardware. For example, when implemented in hardware, the hardware may comprise one or more of discrete components, an integrated circuit, an application-specific integrated circuit (ASIC), etc.

When a suitable processor executing machine readable instructions is available, at least some of the various blocks, operations, and techniques described above may be implemented in suitable hardware, a processor executing firmware and/or software instructions, or any combination thereof. When implemented utilizing a processor executing software or firmware instructions, the software or firmware instructions may be stored in any computer readable memory such as on a magnetic disk, an optical disk, in a RAM or ROM or flash memory, processor, hard disk drive, optical disk drive, tape drive, etc., or other non-transitory tangible storage medium. Likewise, the software or firmware instructions may be delivered to a user or a system via any known or desired delivery method.

While the present invention has been described with reference to specific examples, which are intended to be illustrative only and not to be limiting of the invention, changes, additions and/or deletions may be made to the disclosed embodiments without departing from the scope of the invention.

What is claimed is:

1. A method, comprising:
   a) receiving a data unit comprising a primary information data structure and a primary redundancy data structure;
   b) detecting one or more fields in the primary information data structure;
   c) performing a respective secondary error correction operation on each of at least one of the detected one or more fields; and
   d) after act c), performing a primary error correction operation on the data unit using the primary redundancy data structure.

2. A method according to claim 1, wherein act b) comprises detecting a field associated with a secondary redundancy data structure; and
   wherein act c) comprises utilizing the secondary redundancy data structure to perform a secondary error correction operation on the field associated with the secondary redundancy data structure.

3. A method according to claim 2, wherein detecting the field associated with the secondary redundancy data structure comprises detecting a field of a header; and
   wherein utilizing the secondary redundancy data structure to perform the secondary error correction operation on the field of the header comprises utilizing a cyclic redundancy check (CRC) field of the header.

4. A method according to claim 1, wherein act b) comprises detecting a first field in the primary information data structure of the received data unit, wherein the first field was set to a known value by a transmitter device; and
   wherein act c) comprises overriding the first field with the known value.

5. A method according to claim 4, further comprising determining whether the first field is in error; and
   wherein overriding the first field with the known value is performed when it is determined that the first field is in error.

6. A method according to claim 4, wherein detecting the first field comprises detecting a field of a header that was set to the known value by the transmitter device.

7. A method according to claim 4, wherein detecting the first field comprises detecting a payload that was set to the known value by the transmitter device.

8. A method according to claim 1, wherein receiving the data unit comprises receiving a block code codeword; and
   wherein performing the primary error correction operation on the data unit comprises performing a block code decoder operation on the codeword.

9. An apparatus, comprising:
   a processing unit configured to process data units received via a network, wherein each data unit comprises a primary information data structure and a primary redundancy data structure;
   wherein the processing unit is configured to detect one or more fields in the primary information data structure;
   wherein the processing unit includes:
      a secondary error correction unit to perform a respective secondary error correction operation on each of at least one of the one or more fields detected in the primary information data structure, and
      a primary error correction unit to perform a primary error correction operation on the data unit using the primary redundancy data structure after the secondary error correction unit performs the respective secondary error correction operation on each of the at least one of the one or more detected fields.

10. An apparatus according to claim 9, wherein the processing unit is configured to detect, in the primary information data structure, a field associated with a secondary redundancy data structure; and
    wherein the secondary error correction unit is configured to utilize the secondary redundancy data structure to perform the secondary error correction operation on the field associated with the secondary redundancy data structure.

11. An apparatus according to claim 10, wherein the processing unit is configured to detect, in the primary information data structure, a field of a header having a cyclic redundancy check (CRC) subfield; and wherein the secondary error correction unit comprises a CRC decoder configured to perform CRC decoding on the field of the header using the CRC subfield.

12. An apparatus according to claim 9, wherein the processing unit is configured to detect, in the primary information data structure, a field that was set to a known value by a transmitter device; and wherein the secondary error correction unit is configured to override the first field with the known value.

13. An apparatus according to claim 12, wherein the secondary error correction unit is configured to:

determine whether the first field is in error, and override the first field when it is determined that the first field is in error.

14. An apparatus according to claim 12, wherein the secondary error correction unit is configured to override a value of a field of a header in the primary information data structure, wherein the field of the header was set to the known value by the transmitter device.

15. An apparatus according to claim 12, wherein the secondary error correction unit is configured to override a value of a payload in the primary information data structure, wherein the payload was set to the known value by the transmitter device.

16. An apparatus according to claim 9, wherein the data unit is a block code codeword; and wherein the primary error correction unit comprises a block code decoder to decode the data unit using the primary redundancy data structure.

17. An apparatus according to claim 9, wherein the secondary error correction unit is configured to detect the one or more fields in the primary information data structure.

18. An apparatus, comprising:

a processing unit configured to process block code forward error correction (FEC) encoded data units received via a network, wherein each data unit comprises a primary information data structure and a primary redundancy data structure;

wherein the processing unit is configured to detect a field in the primary information data structure;

wherein the processing unit includes:

a secondary error correction unit to correct an error in the detected field, and a primary error correction unit to perform a primary error correction operation on the data unit using the primary redundancy data structure after the secondary error correction unit corrects the error in the detected field.

19. An apparatus according to claim 18, wherein the secondary error correction unit is configured to perform a secondary error correction operation on the field using a secondary redundancy data structure in the data unit and associated with the field.

20. An apparatus according to claim 18, wherein the secondary error correction unit is configured to set the field to a known value.

\* \* \* \* \*